United States Patent
Liao et al.

(10) Patent No.: US 8,946,775 B2
(45) Date of Patent: Feb. 3, 2015

(54) NITRIDE SEMICONDUCTOR STRUCTURE

(75) Inventors: Chen-Zi Liao, Nantou County (TW);
Chih-Wei Hu, Taoyuan County (TW);
Yen-Hsiang Fang, New Taipei (TW);
Rong Xuan, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 53 days.

(21) Appl. No.: 13/591,232

(22) Filed: Aug. 22, 2012

(65) Prior Publication Data

US 2014/0054593 A1  Feb. 27, 2014

(51) Int. Cl.
*H01L 21/02* (2006.01)

(52) U.S. Cl.
USPC .......... 257/191; 257/190; 257/E33.025; 257/E33.028; 257/E33.034

(58) Field of Classification Search
CPC .................................................. H01L 29/2003
USPC ............ 257/190, 191, E33.028, E33.025, 257/E33.034
See application file for complete search history.

(56) References Cited

U.S. PATENT DOCUMENTS

| 6,617,060 | B2 | 9/2003 | Weeks, Jr. et al. | |
| 6,649,287 | B2 | 11/2003 | Weeks, Jr. et al. | |
| 7,361,576 | B2 | 4/2008 | Imer et al. | |
| 7,491,983 | B2 * | 2/2009 | Otsuka et al. | 257/183 |
| 7,666,765 | B2 | 2/2010 | Cheng et al. | |
| 7,781,356 | B2 | 8/2010 | Kouvetakis et al. | |
| 2002/0187356 | A1 * | 12/2002 | Weeks et al. | 428/446 |
| 2004/0099871 | A1 | 5/2004 | Izumi et al. | |

FOREIGN PATENT DOCUMENTS

| CN | 1619843 | 5/2005 |
| CN | 1755955 | 4/2006 |
| TW | 200810151 | 2/2008 |
| TW | 200917337 | 4/2009 |

OTHER PUBLICATIONS

H. S. Cheong, et al., "Direct heteroepitaxial lateral overgrowth of GaN on stripe-patterned sapphire substrates with very thin SiO2 masks", phys. stat. sol. (b), vol. 241, No. 12, 2004, pp. 2763-2766.
Dandan Zhu, et al, "Efficiency measurement of GaN-based quantum well and light-emitting diode structures grown on silicon substrates", Journal of Applied Physics, vol. 109, No. 014502, 2011, pp. 014502-1-014502-6.
Te-Chung Wang, et al., "Trenched epitaxial lateral overgrowth of fast coalesced a-plane GaN with low dislocation density", Applied Physics Letters, vol. 89, No. 251109, 2006, pp. 251109-1-251109-3.
T. Hikosaka, etal., "Fabrication and properties of semi-polar (1-101) and (11-22) InGaN/GaN light emitting diodes on patterned Si substrates", Phys. Stat. Sol. (c), vol. 5, No. 6, 2008, pp. 2234-2237.
D. Zhu, et al., "GaN-based LEDs grown on 6-inch diameter Si (111) substrates by MOVPE", Proc. of SPIE, vol. 7231, 2009, pp. 723118-1-723118-11.

* cited by examiner

*Primary Examiner* — Amar Movva
(74) *Attorney, Agent, or Firm* — Jianq Chyun IP Office

(57) ABSTRACT

A nitride semiconductor structure is provided. The nitride semiconductor structure at least includes a silicon substrate, a AlN layer, a AlGaN layer and a GaN layer formed on the AlGaN layer. The silicon substrate has a surface tilted at 0<tilted≤0.5° with respect to a axis perpendicular to a (111) crystal plane, and the AlN layer is formed on the surface. The AlGaN layer is formed on the AlN layer. Moreover, an Al content in the AlGaN layer is decreased gradually in a layer thickness direction from the silicon substrate side toward the GaN layer side.

19 Claims, 8 Drawing Sheets

US 8,946,775 B2

NITRIDE SEMICONDUCTOR STRUCTURE

TECHNICAL FIELD

The technical field relates to a nitride semiconductor structure.

BACKGROUND

Nowadays, it has been proved that Gallium Nitride-based (GaN-based) semiconductor material has potential for the commercial applications to the backlight module of LCD, optical storage system, high frequency and high power microwave electronic device, and so on. As to the epitaxial growth of GaN-based semiconductor material, sapphire substrate is mainly used as substrate.

However, it is a main topic to reduce production cost and to improve film quality in the application of lighting and electronic devices, and therefore, silicon substrate tends to be utilized for cost down. Nevertheless, the derivational issue is the mismatch between nitride and silicon in lattice constant and thermal expansion coefficient, and thus it may cause GaN epitaxial layer to have considerable cracks and tensile stress. Accordingly, the yield of large-size GaN epitaxial chip is too low to reduce production cost.

SUMMARY

One of exemplary embodiments comprises a nitride semiconductor structure including a silicon substrate, a AlN layer, a AlGaN layer and a GaN layer formed on the AlGaN layer. The silicon substrate has a surface tilted at $0<tilted\leq0.5°$ with respect to a axis perpendicular to a (111) crystal plane. The AlN layer is formed on the surface of the silicon substrate. The AlGaN layer is formed on the AlN layer, and an Al content in the AlGaN layer is decreased gradually in a layer thickness direction from the AlN layer side toward the GaN layer side.

Another of exemplary embodiments comprises a nitride semiconductor structure including a silicon substrate, a AlN layer, a AlGaN layer and a GaN layer formed on the AlGaN layer. The AlN layer is formed on the surface of the silicon substrate. The AlGaN layer is formed on the AlN layer. A variation rate in the lattice constant of the AlGaN layer is from 5.08%/μm to 1.27%/μm.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
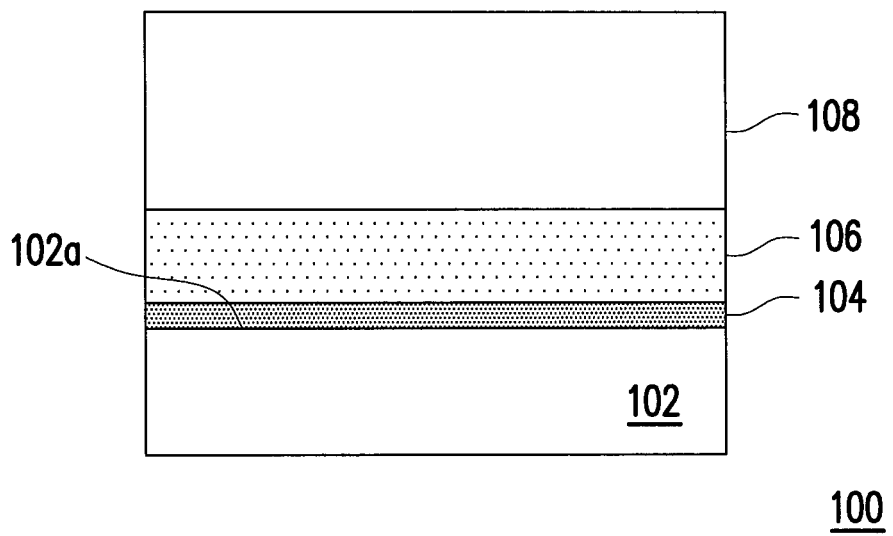
FIG. 1 is a schematic diagram illustrating nitride semiconductor structure according to a first exemplary embodiment.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

FIG. 1 is a schematic diagram illustrating nitride semiconductor structure according to a first exemplary embodiment.

Figure 2A:
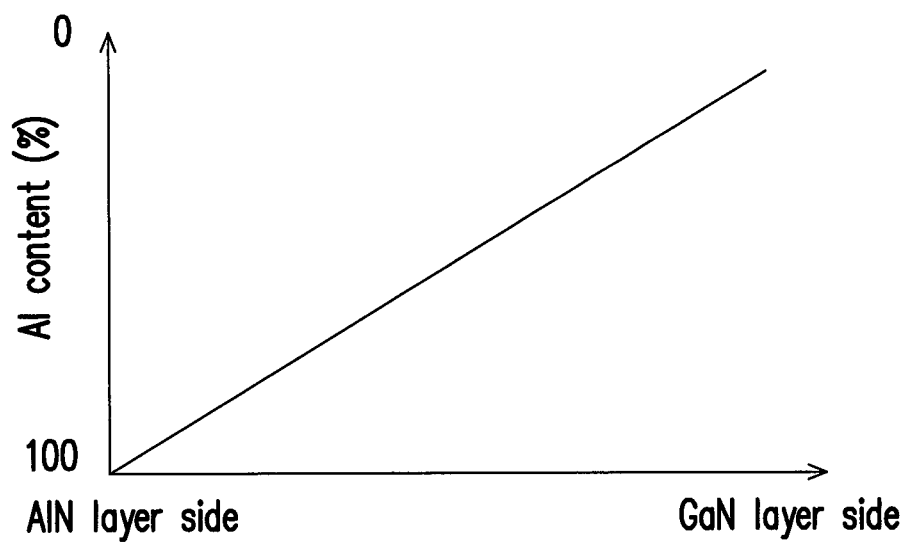
FIG. 2A is one curve diagram illustrating the Al content in the AlGaN layer according to the first exemplary embodiment.
Figure 2B:
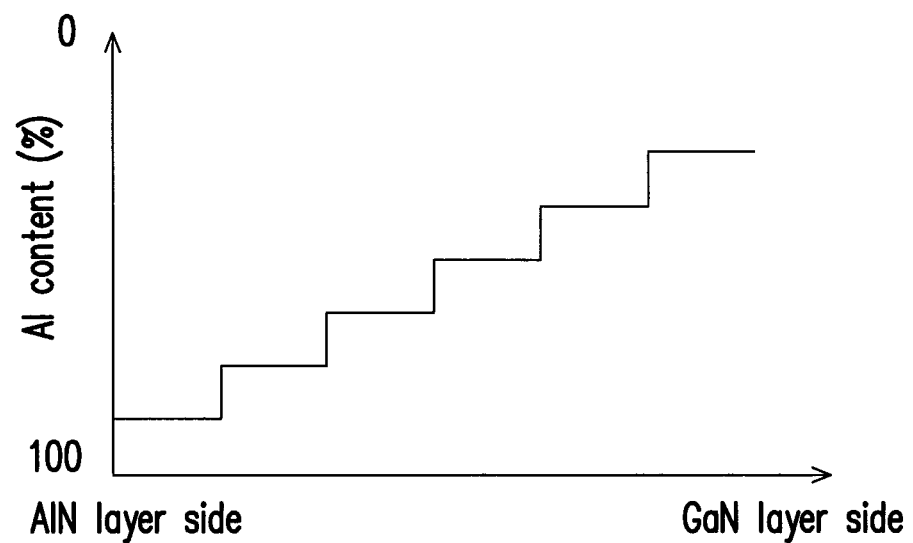
FIG. 2B is another curve diagram illustrating the Al content in the AlGaN layer according to the first exemplary embodiment.

Referring to FIG. 1, the nitride semiconductor structure 100 includes a silicon substrate 102, a AlN layer 104, a AlGaN layer 106 and a GaN layer 108. The silicon substrate 102 may be a (111) silicon substrate. Alternatively, the silicon substrate 102 has a surface 102a tilted at $0<tilted\leq0.5°$ with respect to a axis perpendicular to a (111) crystal plane. For example, the surface 102a may be tilted at $0<tilted\leq0.2°$ with respect to the axis perpendicular to the (111) crystal plane. In addition, the silicon substrate 102 may be single crystal silicon, and preferably be group V element doped silicon (i.e. phosphorous doped silicon), but the disclosure is not limited thereto. The AlN layer 104 is formed on the surface 102a of the silicon substrate 102. The AlGaN layer 106 is formed on the AlN layer 104. In the AlGaN layer 106, its aluminum (Al) content is decreased gradually in a layer thickness direction from the AlN layer 104 side toward the GaN layer 108 side. For instance, the Al content in the AlGaN layer 106 may be decreased continuously (referring to FIG. 2A) or decreased stepwise (referring to FIG. 2B). Since the Al content in the AlGaN layer 106 gradually decreases, the lattice constant of the AlGaN layer 106 approximates that of AlN at a lower surface in contact with the AlN layer 104 and approximates that of GaN at an upper layer in contact with the GaN layer 108. Thereby, an internal stress of the GaN layer 108 is decreased, leading to prevention of generation of the crack.

In the first exemplary embodiment, a sum of the thicknesses of the AlN layer 104, the AlGaN layer 106 and the GaN layer 108 is at least 3 μm. In the exemplary example, a thickness of the AlN layer 104 is about 50-150 nm, and a thickness of the GaN layer 108 is about 0.5-5 μm. When a thickness of the AlGaN layer 106 is from 0.5 μm to 2 μm, a variation rate in the lattice constant of the AlGaN layer 106 is from 5.08%/μm to 1.27%/μm, for example.

The so-called "variation rate in the lattice constant" represents a ratio of the lattice constant variation to the thickness. The lattice constants of (0001) AlN and (0001) GaN in a-axis are 3.11 Å and 3.189 Å, respectively. The variation rate of lattice constant in percentage (%) is equal to $$\frac{GaN - AlN}{AlN} \times 100\% = \frac{3.189 - 3.11}{3.11} \times 100\% = 2.54\%.$$

The variation rate of lattice constant divided by the thickness of the AlGaN layer 106 is from 5.08%/μm to 1.27%/μm. The structure having the variation rate in the lattice constant may reduce stress build in epitaxy layer and improve the crystal quality.

Figure 3:
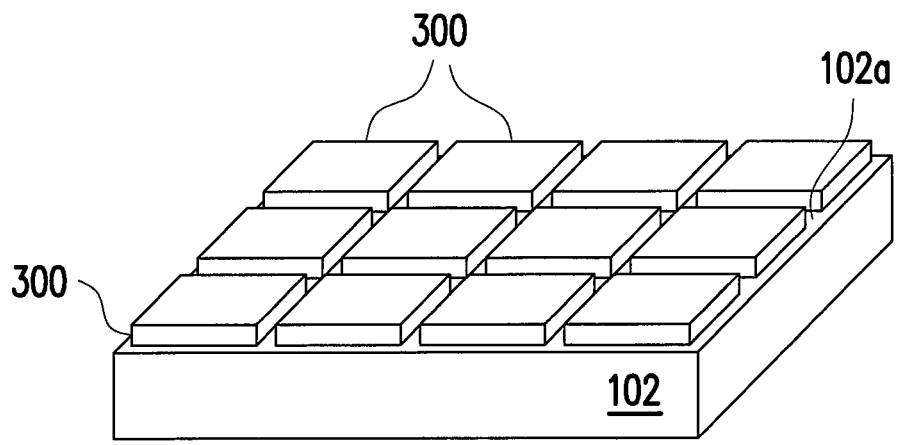
FIG. 3 is a schematic diagram illustrating the silicon substrate according to the first exemplary embodiment.

Moreover, the surface 102a of the silicon substrate 102 in the first exemplary embodiment may be a flat surface or comprise patterns as shown in FIG. 3. In FIG. 3, the surface 102a of the silicon substrate 102 has a plurality of rectangular protrusions 300, so as to reduce stress in the AlGaN layer and further increasing the thickness of the GaN layer. The size of each rectangular protrusion 300 may be the same as desired area of a device manufactured on the GaN layer, for example.

Figure 4:
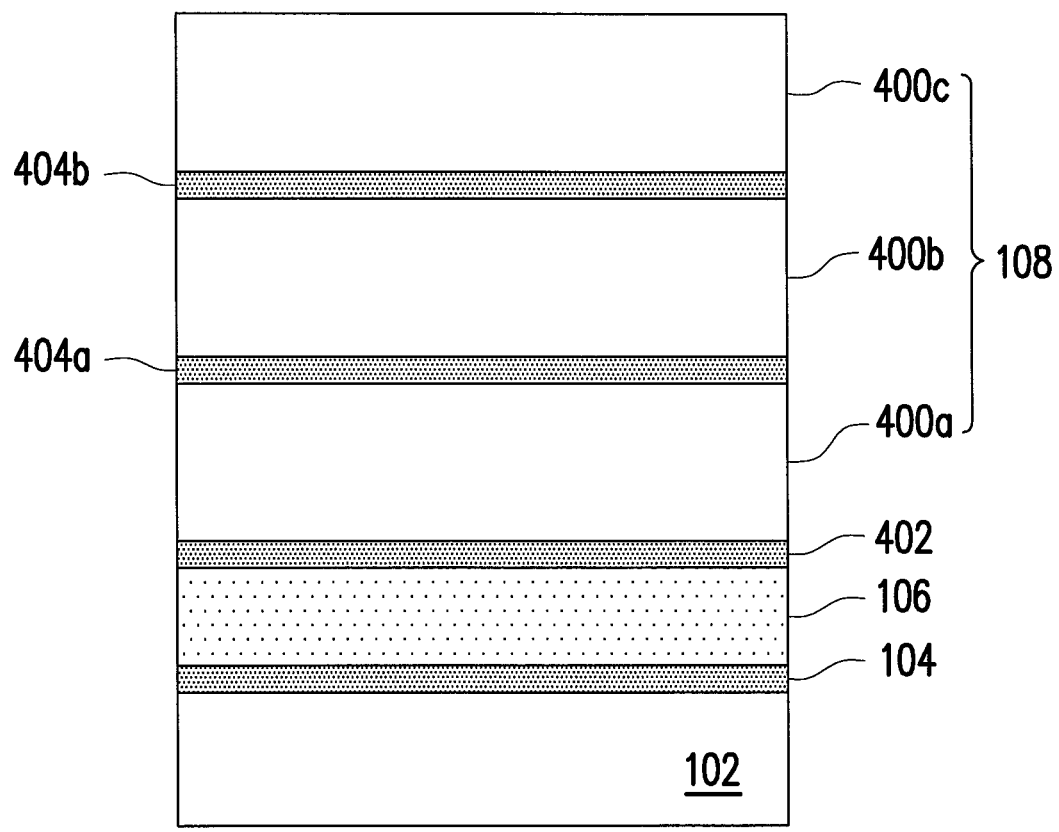
FIG. 4 is a schematic diagram illustrating nitride semiconductor structure according to a second exemplary embodiment.

FIG. 4 is a schematic diagram illustrating nitride semiconductor structure according to a second exemplary embodiment, in which element numerals being the same as those in the first embodiment are used to indicate the same elements.

In FIG. 4, the nitride semiconductor structure 400 also includes a silicon substrate 102, a AlN layer 104, a AlGaN layer 106 and a GaN layer 108. The differences between the first exemplary embodiment and the second exemplary embodiment in the GaN layer 108 is a multilayered structure comprising a first AlN interlayer 402 disposed between the GaN layer 108 and the AlGaN layer 106, a second AlN interlayers 404a and a third AlN interlayer 404b inserted in the GaN layer 108 and dividing into a first, a second, and a third GaN films 400a-c. In this case, a total thickness of the GaN films 400a-c may be more than 1.7 μm thick. The first AlN interlayer 402 may be as thin as the second AlN interlayer 404a or the third AlN interlayer 404b, for example.

A plurality of experimental results is provided below to verify the effect of the exemplary embodiments.

Experimental Examples 1-3

Three single crystal silicon substrates are provided, and each has a surface tilted at 0.5° with respect to a axis perpendicular to the (111) crystal plane. Stacked layers comprising AlN (100 nm)/AlGaN (1200 nm)/GaN (1300 nm) are grown on the tilted surface of the Si substrate by metal organic chemical vapor deposition (MOCVD). The Al content in the AlGaN layer is continuously decreased from 100 at % to 0 at %. The difference between Experimental examples 1-3 is related to the epitaxial growth temperature. In detail, the GaN layers in Experimental examples 1-3 are grown at 1130° C., 1080° C., and 1030° C. respectively. Each GaN layer of Experimental examples 1-3 is then examined. The result is shown in Table 1.

Comparative Examples 1-3

Except for the surface of each single crystal silicon substrate is a (111) silicon substrate, the manufacturing methods of Comparative examples 1-3 are the same as Experimental examples 1-3. Each GaN layer of Comparative examples 1-3 is then examined. The result is shown in Table 1.

TABLE 1

| Tg (° C.) | Sample | carrier concentration (cm$^{-3}$) | (002) | (102) |
|---|---|---|---|---|
| 1130 | Experimental example 1 | $1 \times 10^9$ | 388 | 570 |
|  | Comparative example 1 | $1.5 \times 10^9$ | 386 | 655 |
| 1080 | Experimental example 2 | $7.6 \times 10^8$ | 410 | 600 |
|  | Comparative example 2 | $8 \times 10^8$ | 420 | 800 |
| 1030 | Experimental example 3 | $1.5 \times 10^9$ | 450 | 800 |
|  | Comparative example 3 | $1.2 \times 10^9$ | 473 | 1200 |

Table 1 shows that the FWHM of (102) XRD of GaN layers of Experimental examples 1-3 are significantly decreased in comparison with Comparative examples 1-3. Therefore, the experimental examples 1-3 obtain lower value of FWHM of (102) XRD than the Comparative examples 1-3 while lower value of FWHM of (102) XRD indicates the lower density of threading dislocations and the better crystalline quality.

Experimental Example 4

Figure 5:
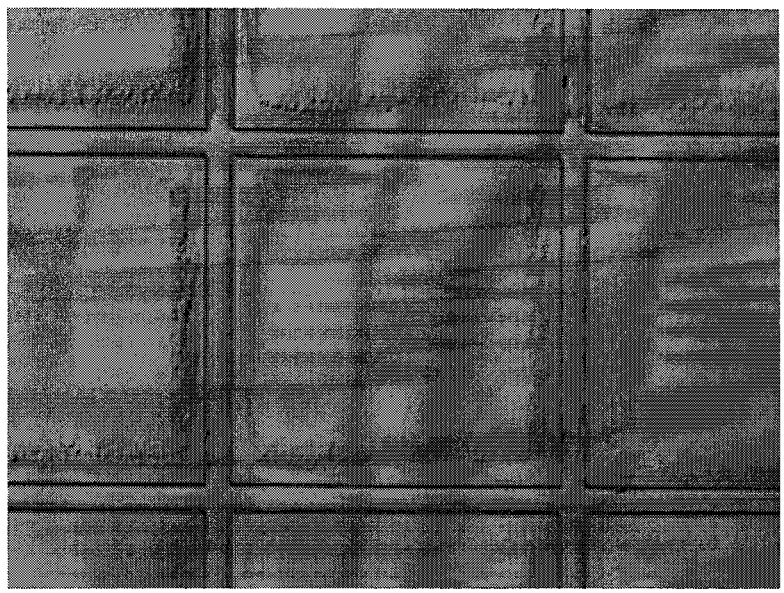
FIG. 5 is an optical micrograph of a GaN layer according to Experimental example 4.

A (111) silicon substrate is patterned to form rectangular protrusions. In detail, the area of each rectangular protrusion is about 300×300 μm$^2$, the thickness of each rectangular protrusion is about 2 μm, and the interval between the two rectangular protrusions is about 40 μm. Stacked layers comprising AlN (100 nm)/multilayered AlGaN (1200 nm)/GaN (1300 nm) are grown on the silicon substrate by MOCVD. The Al content in the multilayered AlGaN layer is decreased stepwise from the AlN layer toward the GaN layer, and the multilayered AlGaN layer includes a first thin film with 40 at % Al and 150 nm thick, a second thin film with 30 at % Al and 200 nm thick, a third thin film with 20 at % Al and 400 nm thick, and a fourth thin film with 10 at % Al and 450 nm thick. Through optical microscope (OM), FIG. 5 shows the surface of the GaN layer in the Experimental example 4 is crack free.

Comparative Example 4

Figure 6:
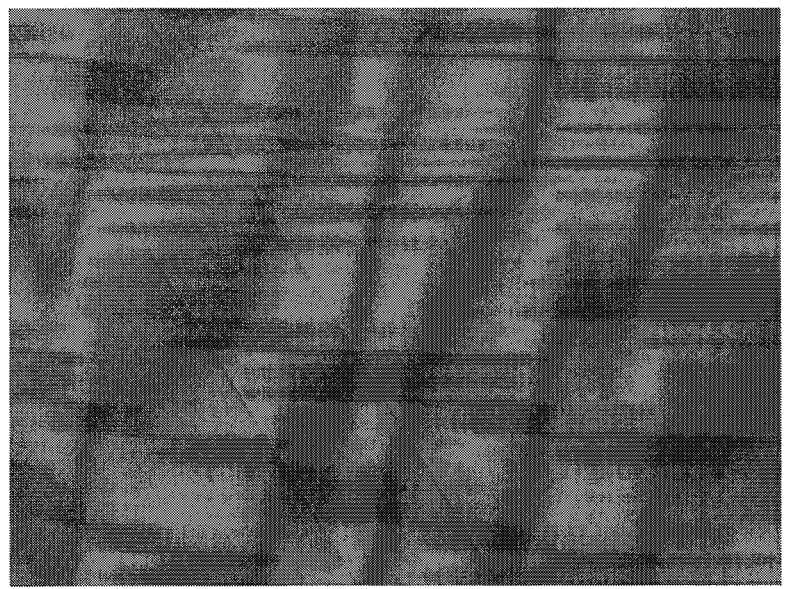
FIG. 6 is an optical micrograph of a GaN layer according to Comparative example 4.

Except for the silicon substrate is not patterned, the manufacturing method is the same as Experimental example 4. Through optical microscope (OM), FIG. 6 shows that there are some cracks on the surface of the GaN layer in the Comparative example 4.

Experimental Example 5

Figure 7:
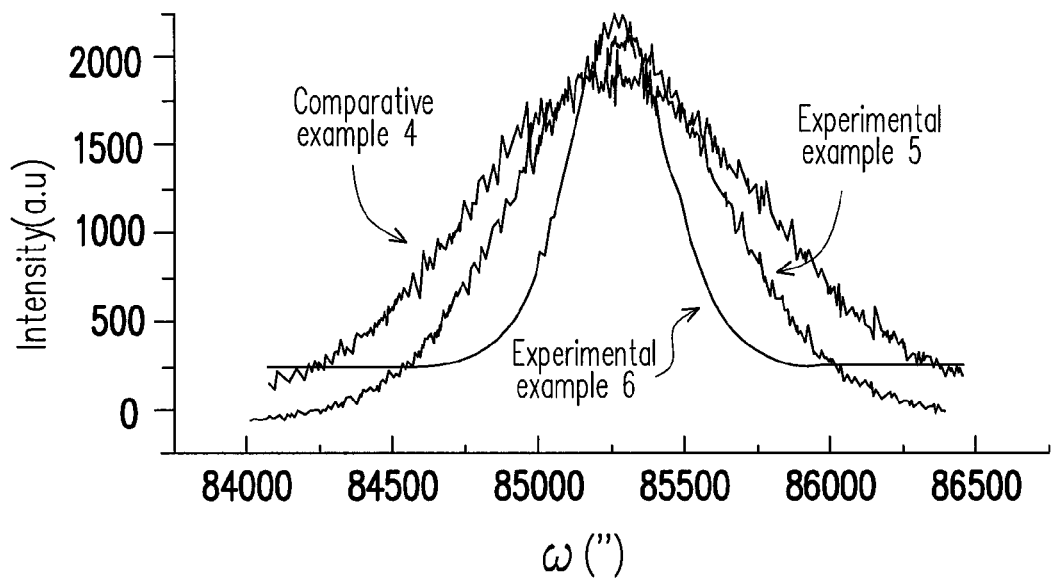
FIG. 7 is a curve diagram illustrating (102) XRD rocking curves of the Experimental examples 5-7.

A stacked layer comprising AlN (100 nm)/AlGaN (1200 nm)/GaN (1300 nm) is grown on a flat undoped silicon substrate by MOCVD. The Al content in the AlGaN layer is continuously decreased from 100 at % to 0 at %. The GaN layer of Experimental example 5 is then examined. The result is shown in FIG. 7.

Experimental Example 6

Except for the silicon substrate having a surface tilted at 0.5° with respect to a axis perpendicular to the (111) crystal plane, the manufacturing method is the same as Experimental example 5. The GaN layer of Experimental example 6 is then examined. The result is shown in FIG. 7.

Experimental Example 7

Except for doping phosphorous in the silicon substrate, the manufacturing method is the same as Experimental example 5. The doping concentration is from $-1 \times 10^{15}$/cm$^3$ to $-1 \times 10^{16}$/ cm³. The GaN layer of Experimental example 7 is then examined. The result is shown in FIG. 7.

FIG. 7 is a curve diagram illustrating the (102) XRD rocking curves of the Experimental examples 5-7. In FIG. 7, it shows that GaN layer grown on the phosphorous doped Si substrate has lower FWHM of (102) XRD and indicates the lower density of threading dislocations and the better crystalline quality. Thus, the phosphorous doped silicon substrate is helpful to grow GaN layer.

Experimental Example 8

Figure 8:
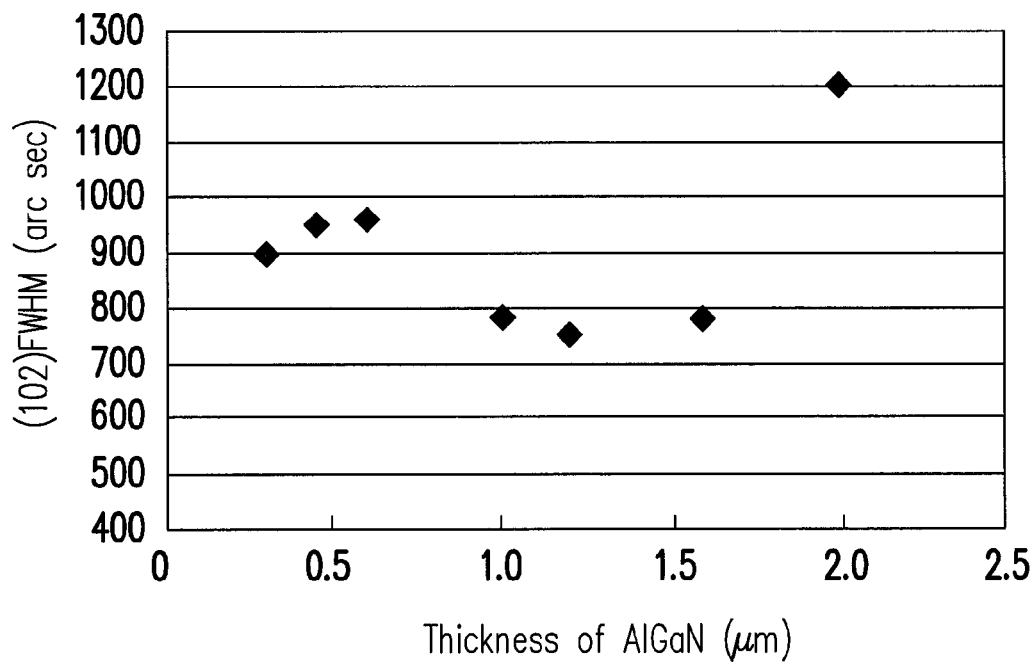
FIG. 8 is a curve diagram illustrating the relationship between the thickness of AlGaN layer and (102) XRD FWHM of GaN according to of the Experimental example 8.

A stacked layer comprising AlN (100 nm)/AlGaN/GaN (1300 nm) is grown on the (111) silicon substrate. The Al content in the AlGaN layer is decreased continuously in the layer thickness direction from the AlN layer side toward the GaN layer side. In particular, the Al content in the AlGaN layer is continuously decreased from 100 at % to 0 at %. Moreover, the thickness of the AlGaN layer is also varied from 0.3 μm to 2 μm. The GaN layers of Experimental example 8 are then examined. The result is shown in FIG. 8. FIG. 8 is a curve diagram illustrating the relationship between the thickness of AlGaN layer and the FWHM of (102) XRD of GaN layer. In FIG. 8, it shows that the desirable range of the thickness of the AlGaN layer is about 1-1.75 μm. In this range, the FWHM of (102) XRD of GaN exhibits a lowest value which indicates the lower density of threading dislocations and the better crystalline quality the Experimental example 7 achieved.

Experimental Example 9

Figure 9A:
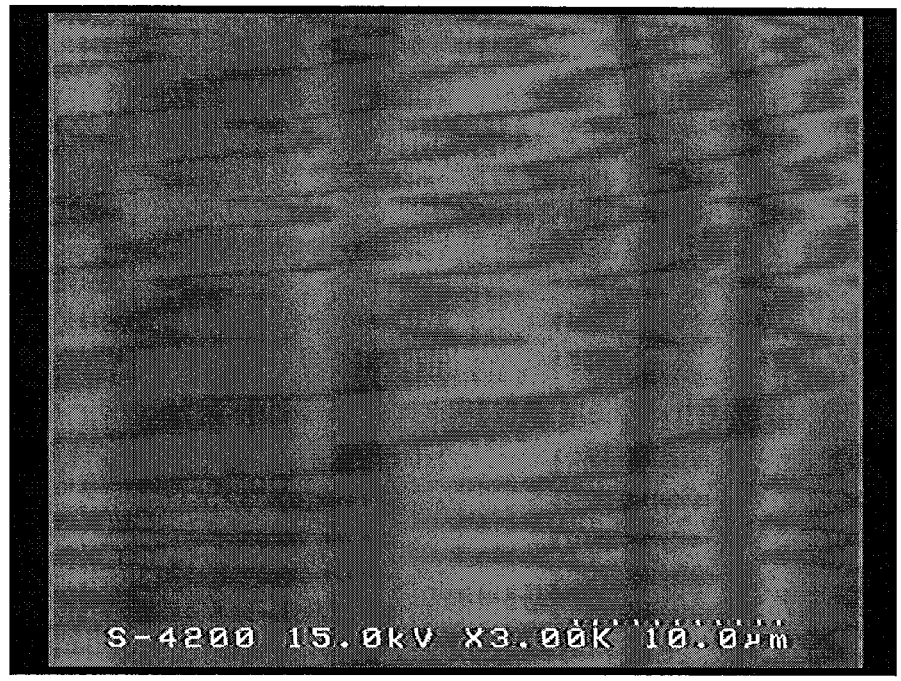
FIGS. 9A and 9B are optical micrographs of a GaN layer according to Experimental example 9.
Figure 9B:
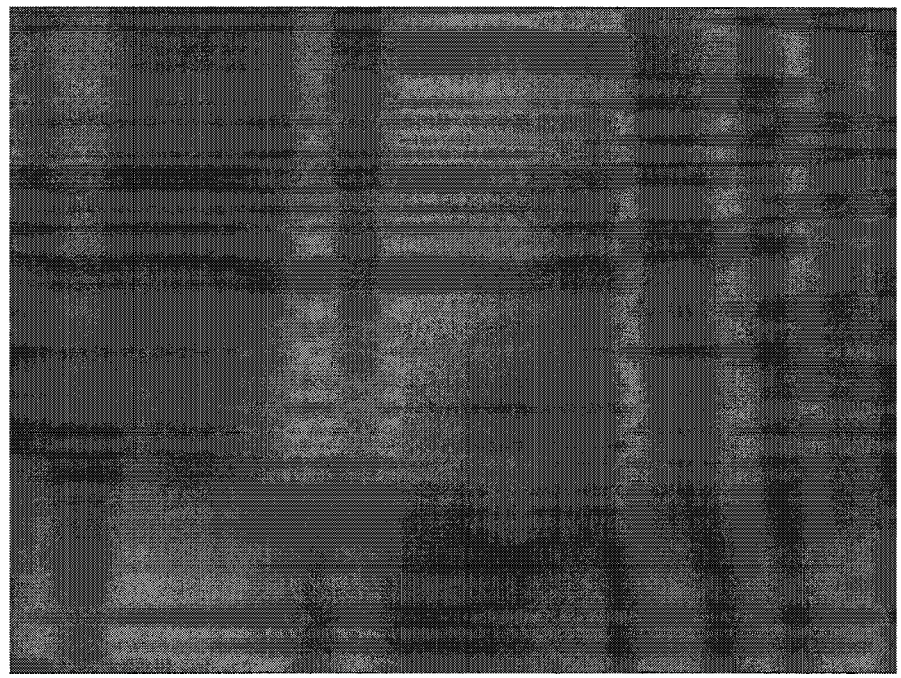

A stacked layer comprising AlN (100 nm)/multilayered AlGaN (1200 nm)/GaN (1300 nm) is grown on a (111) silicon substrate by MOCVD. The Al content in the multilayered AlGaN layer is decreased stepwise from the AlN layer toward the GaN layer, and the multilayered AlGaN layers includes a first thin film with 40 at % Al and 150 nm thick, a second thin film with 30 at % Al and 200 nm thick, a third thin film with 20 at % Al and 400 nm thick, and a fourth thin film with 10 at % Al and 450 nm thick. Through optical microscope (OM), FIGS. 9A and 9B show that the GaN layer in the Experimental example 9 is free of cracks and pits.

Comparative Example 5

Figure 10A:
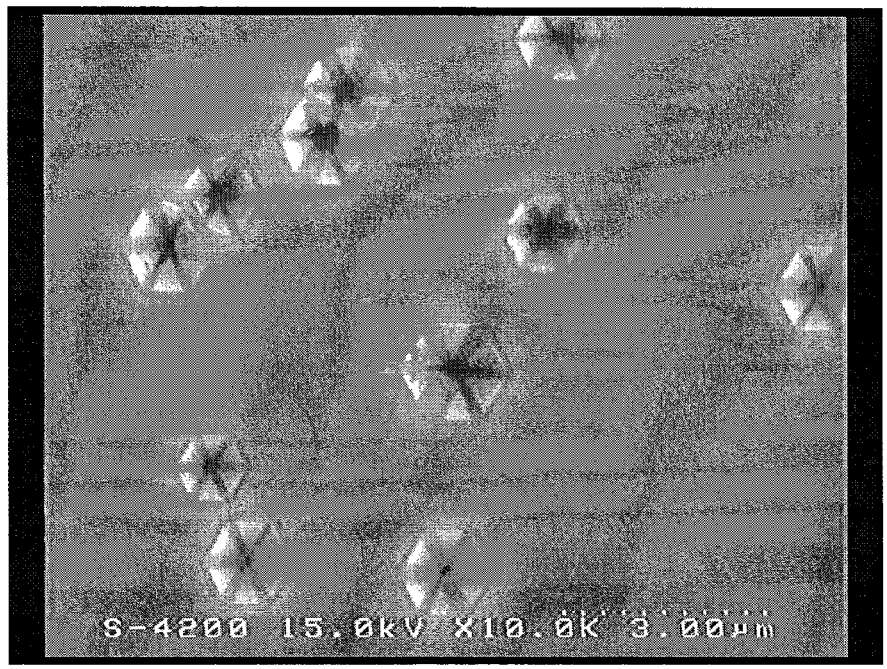
FIGS. 10A and 10B are optical micrographs of a GaN layer according to Comparative example 5.
Figure 10B:
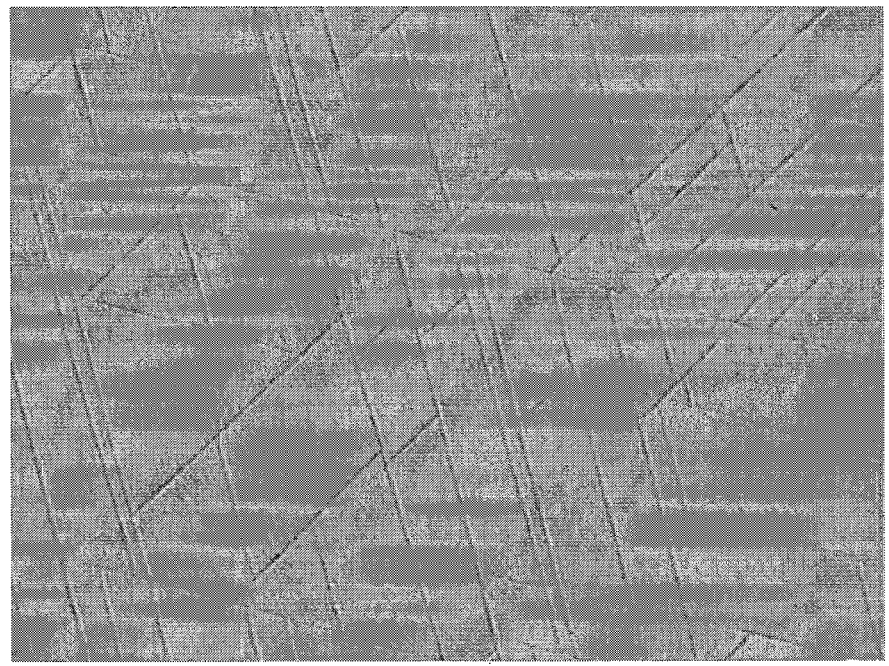

Except for the absent of the multilayer AlGaN, the manufacturing method is the same as Experimental example 9. Through OM, FIGS. 10A and 10B respectively show that the GaN layer in the Comparative example 5 has distinct cracks and pits.

Experimental Example 10

Figure 11:
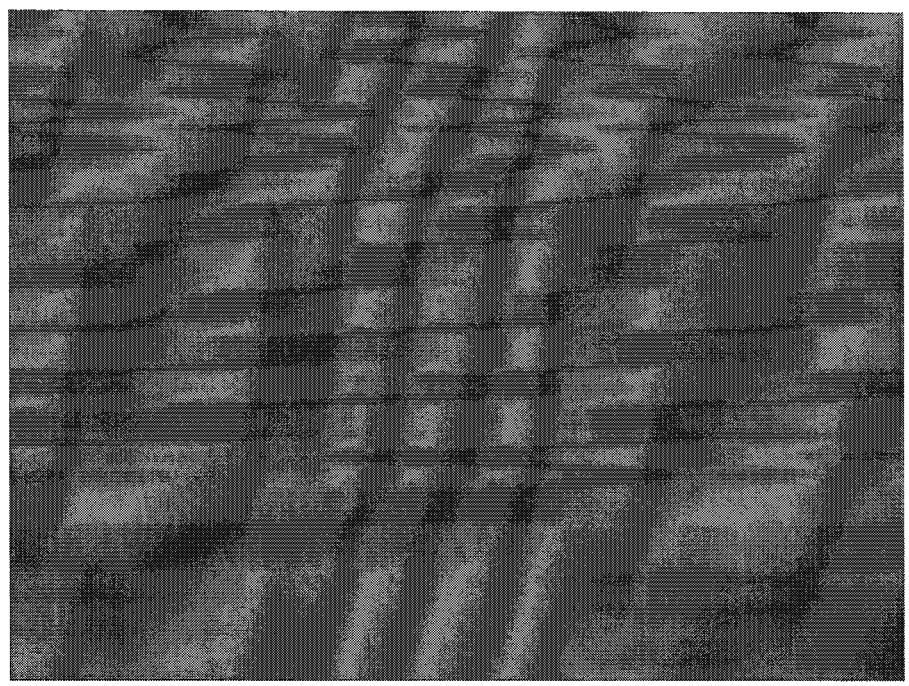
FIG. 11 is an optical micrograph of the third GaN film according to Experimental example 10.

An AlN layer of 100 nm is grown on a (111) silicon substrate and then a multilayer AlGaN layer of 1200 nm is grown on the AlN layer. The multilayer AlGaN layer is the same as that in Experimental example 9. A first AlN interlayer of 10 nm is grown on the multilayer AlGaN layer, and a first GaN film of 750 nm is then grown on the first AlN interlayer. A second AlN interlayer of 10 nm is grown on the first GaN film, and a second GaN film of 1000 nm is then grown on the second AlN interlayer. A third AlN interlayer of 10 nm is grown on the second GaN film, and a third GaN film of 1000 nm is then grown on the third AlN interlayer. Through OM, FIG. 11 shows that the third GaN film in the Experimental example 10 is crack free.

In view of the above, the disclosure utilizes a graded AlGaN layer in Al content, and thus the cracks in the GaN layer may be eliminated and the quality of the GaN layer may be improved. Moreover, the disclosure utilizes a silicon substrate having a tilted surface, so the lower density of threading dislocations and the better crystalline quality in the GaN layer may be obtained. In addition, the GaN layer is grown on the doped Si substrate according to the disclosure, and thus the density of threading dislocations therein may be reduced and its crystalline quality may be increased. Furthermore, due to the presence of the AlN interlayers sandwiched by the GaN films, the GaN films in the disclosure tend to crack free.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A nitride semiconductor structure, comprising:
   a silicon substrate, having a surface tilted at 0<tilted≤0.5° with respect to a axis perpendicular to a (111) crystal plane;
   a AlN layer, formed on the surface of the silicon substrate;
   a AlGaN layer, formed on the AlN layer; and
   a GaN layer, formed on the AlGaN layer, wherein an Al content in the AlGaN layer is decreased gradually in a layer thickness direction from the AlN layer side toward the GaN layer side, wherein the GaN layer is a multi-layer structure comprising a plurality of GaN films.

2. The nitride semiconductor structure according to claim 1, wherein the Al content in the AlGaN layer is decreased continuously in the layer thickness direction from the AlN layer side toward the GaN layer.

3. The nitride semiconductor structure according to claim 1, wherein the Al content in the AlGaN layer is decreased stepwise in the layer thickness direction from the AlN layer side toward the GaN layer side.

4. The nitride semiconductor structure according to claim 1, wherein a thickness of the AlGaN layer is from 0.5 μm to 2 μm.

5. The nitride semiconductor structure according to claim 1, wherein the surface of the silicon substrate comprises a plurality of rectangular protrusions.

6. The nitride semiconductor structure according to claim 1, wherein the silicon substrate comprises single crystal silicon.

7. The nitride semiconductor structure according to claim 1, wherein the silicon substrate comprises group V element doped silicon.

8. The nitride semiconductor structure according to claim 1, further comprising a first AlN interlayer between the GaN layer and the AlGaN layer.

9. The nitride semiconductor structure according to claim 1, further comprising a second AlN interlayer between two of the plurality of GaN films.

10. A nitride semiconductor structure, comprising:
   a silicon substrate;
   a AlN layer, formed on the surface of the silicon substrate;
   a AlGaN layer, formed on the AlN layer, wherein a variation rate in the lattice constant of the AlGaN layer is from 5.08%/μm to 1.27%/μm; and
   a GaN layer, formed on the AlGaN layer, wherein the GaN layer is a multilayered structure comprising a plurality of GaN films.

11. The nitride semiconductor structure according to claim 10, wherein the Al content in the AlGaN layer is decreased continuously in the layer thickness direction from the AlN layer side toward the GaN layer.

12. The nitride semiconductor structure according to claim 10, wherein the Al content in the AlGaN layer is decreased stepwise in the layer thickness direction from the AlN layer side toward the GaN layer side.

13. The nitride semiconductor structure according to claim 10, wherein a thickness of the AlGaN layer is from 0.5 μm to 2 μm.

14. The nitride semiconductor structure according to claim 10, wherein the silicon substrate has a surface tilted at $0<\text{tilted}\leq0.5°$ with respect to a axis perpendicular to a (111) crystal plane.

15. The nitride semiconductor structure according to claim 10, wherein the surface of the silicon substrate comprises a plurality of rectangular protrusions.

16. The nitride semiconductor structure according to claim 10, wherein the silicon substrate comprises single crystal silicon.

17. The nitride semiconductor structure according to claim 10, wherein the silicon substrate comprises group V element doped silicon.

18. The nitride semiconductor structure according to claim 10, further comprising a first AlN interlayer between the GaN layer and the AlGaN layer.

19. The nitride semiconductor structure according to claim 10, further comprising a second AlN interlayer between two of the plurality of GaN films.

* * * * *